(12) United States Patent
Fukunaga

(10) Patent No.: US 6,643,306 B2
(45) Date of Patent: Nov. 4, 2003

(54) SEMICONDUCTOR LASER DEVICE IN WHICH COMPRESSIVE STRAIN ACTIVE LAYER IS SANDWICHED BETWEEN TENSILE STRAIN OPTICAL WAVEGUIDE LAYERS AND AVERAGE STRAIN IS LIMITED

(75) Inventor: Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/984,798

(22) Filed: Oct. 31, 2001

(65) Prior Publication Data

US 2002/0051476 A1 May 2, 2002

(30) Foreign Application Priority Data

Oct. 31, 2000 (JP) .................................... 2000-331656
Oct. 19, 2001 (JP) .................................... 2001-322048

(51) Int. Cl.$^7$ .................................................. H01S 5/00
(52) U.S. Cl. .......................................... 372/45; 372/46
(58) Field of Search .............................. 372/45, 46, 11

(56) References Cited

U.S. PATENT DOCUMENTS

| | | | | |
|---|---|---|---|---|
| 4,603,420 A | * | 7/1986 | Nishizawa et al. ........... 372/45 |
| 5,119,393 A | * | 6/1992 | Oka et al. ..................... 372/50 |
| 5,177,758 A | * | 1/1993 | Oka et al. ..................... 372/50 |
| 5,306,924 A | * | 4/1994 | Usami et al. ................. 257/18 |
| 5,381,024 A | * | 1/1995 | Valster ......................... 257/97 |
| 5,389,396 A | * | 2/1995 | Razeghi ........................ 427/58 |
| 5,671,242 A | * | 9/1997 | Takiguchi et al. ............ 372/45 |
| 5,737,353 A | * | 4/1998 | Sasaki .......................... 372/45 |
| 5,889,805 A | * | 3/1999 | Botez et al. ................... 372/45 |
| 6,028,874 A | * | 2/2000 | Wada et al. ................... 372/45 |
| 6,031,858 A | * | 2/2000 | Hatakoshi et al. ............ 372/46 |
| 6,127,691 A | * | 10/2000 | Fukunaga et al. ............ 257/17 |
| 6,233,264 B1 | * | 5/2001 | Sato .............................. 372/45 |
| 6,256,331 B1 | * | 7/2001 | Kitoh et al. ................... 372/46 |
| 6,285,695 B1 | * | 9/2001 | Asano et al. .................. 372/45 |
| 6,396,863 B1 | * | 5/2002 | Fukunaga ..................... 372/46 |
| 6,400,742 B1 | * | 6/2002 | Hatakoshi et al. ............ 372/46 |
| 6,400,743 B1 | * | 6/2002 | Fukunaga et al. ............ 372/46 |

OTHER PUBLICATIONS

Fukunaga, et al. "Reliable Operation of strain–compensated 1.06 $\mu$m InGaAs/InGaAsP/GaAs single quantum will lasers." Applied Physics Letters, vol. 69, Issue 2, pp. 248, 1996.

* cited by examiner

*Primary Examiner*—Paul Ip
*Assistant Examiner*—Tuan Nguyen
(74) *Attorney, Agent, or Firm*—Sughrue Mion, PLLC

(57) ABSTRACT

In a semiconductor laser device having a substrate and an active region, the active region includes an active layer between tensile strain optical waveguide layers. The active layer includes at least one compressive strain quantum well sublayer. When the active layer includes more than one compressive strain quantum well sublayer, the active layer further includes at least one barrier sublayer being formed between the more than one quantum well sublayer and having an identical amount of tensile strain to that of the optical waveguide layers. The absolute value of a sum of a product of the strain and the total thickness of the at least one quantum well sublayer and a product of the strain and the total thickness of the optical waveguide layers and the at least one barrier sublayer (if any) is equal to or smaller than 0.05 nm.

24 Claims, 6 Drawing Sheets

F I G. 1
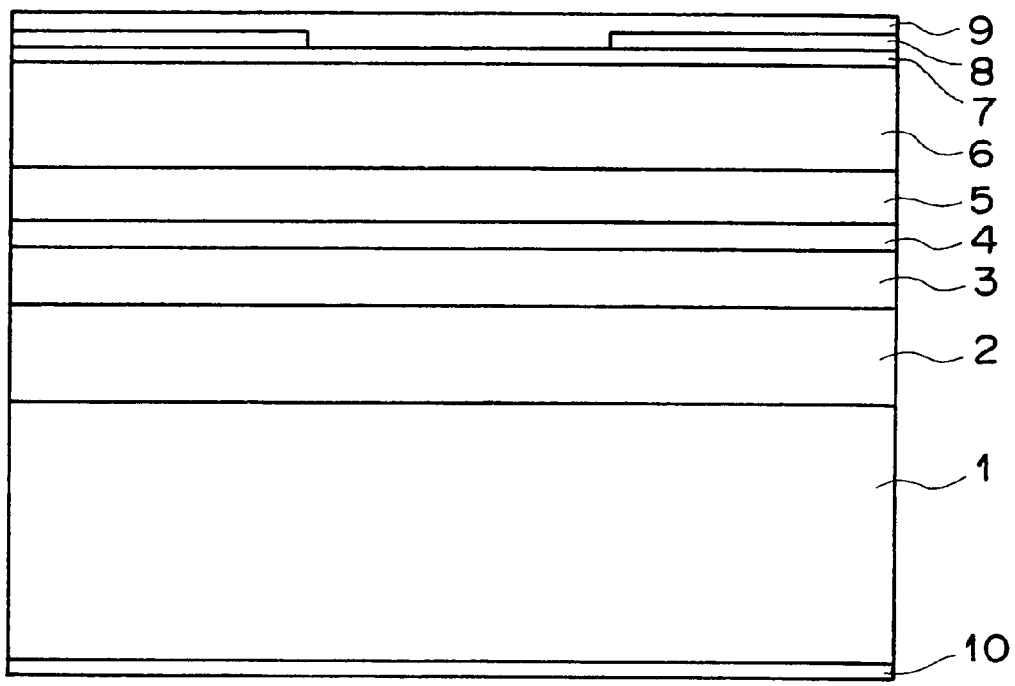

F I G. 3
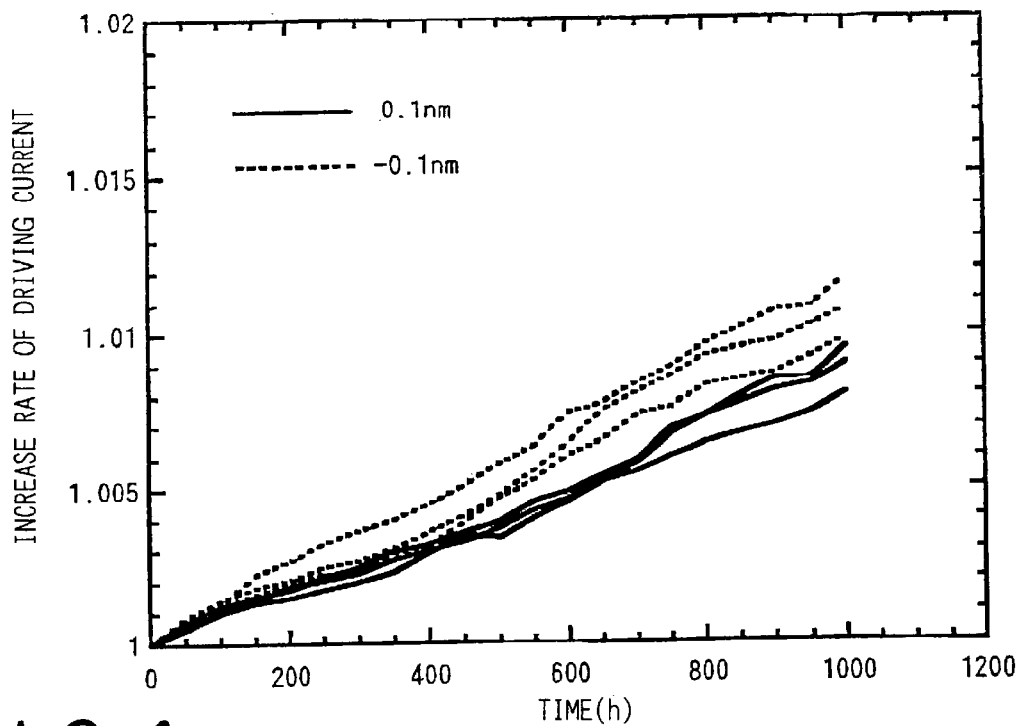
F I G. 4
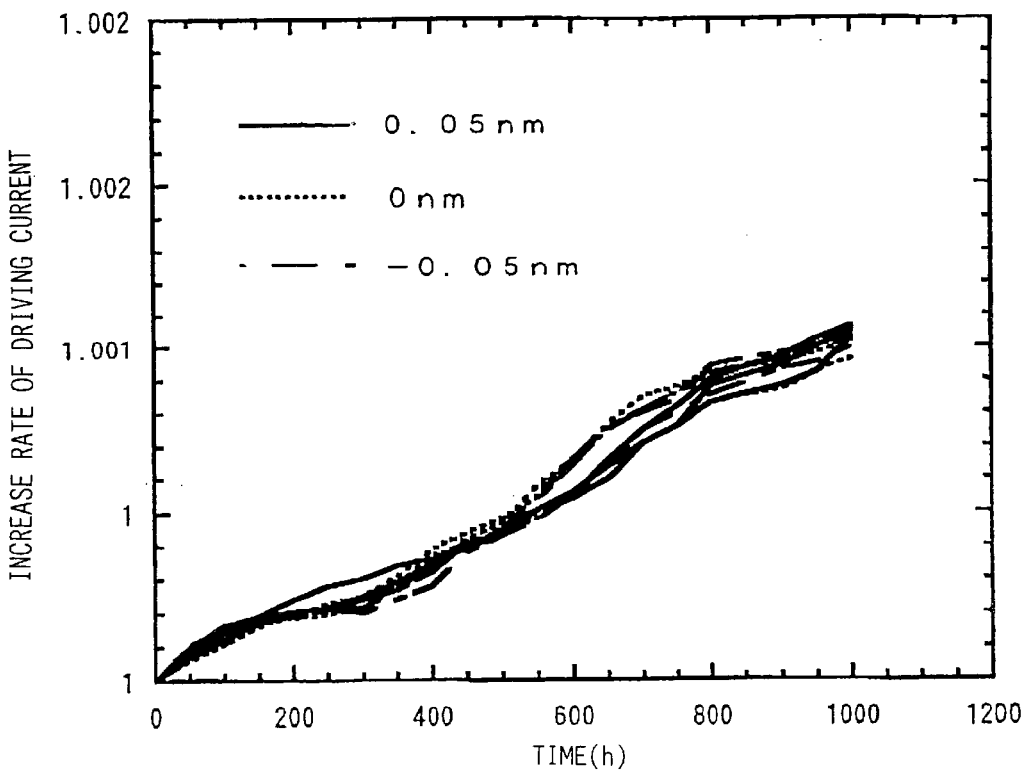

SEMICONDUCTOR LASER DEVICE IN WHICH COMPRESSIVE STRAIN ACTIVE LAYER IS SANDWICHED BETWEEN TENSILE STRAIN OPTICAL WAVEGUIDE LAYERS AND AVERAGE STRAIN IS LIMITED

BACKGROUND OF THE INVENTION

1. Field of the Invention

The present invention relates to a semiconductor laser device having a compressive strain active layer.

2. Description of the Related Art

The active layers in the conventional semiconductor laser devices which are formed on a GaAs substrate and emit laser light having a wavelength of 0.9 to 1.2 micrometers have a composition which causes a compressive strain. Since the compressive strain produces crystal defects or the like, the above semiconductor laser devices cannot attain to satisfactory characteristics and high reliability in operation with high output power.

U.S. Pat. No. 5,671,242 (corresponding to Japanese Unexamined Patent Publication, No. 8(1996)-78786) discloses a stress-compensation semiconductor laser device including a stress-compensation strained quantum well layer in which compressive strain well layers and tensile strain barrier layers are alternately laminated so that the average strain of the entire active layer is a compressive strain. However, when the amount of the compressive strain is increased in this semiconductor laser device, the difference in the strain between the compressive strain well layers and the tensile strain barrier layers increases, and therefore the strong interlayer stress is produced. Thus, it is impossible to achieve satisfactory crystallinity without producing defects in vicinities of the boundaries between the layers.

T. Fukunaga et al. ("Reliable operation of strain-compensated 1.06 μm InGaAs/InGaAsP/GaAs single quantum well lasers," Applied Physics Letters, Vol. 69, Issue 2, pp. 248–250, 1996) report a semiconductor laser device in which an InGaAs strained quantum well active layer is formed above a GaAs substrate, and tensile strain barrier layers are formed adjacent to the InGaAs strained quantum well active layer so as to compensate for the strain in the InGaAs strained quantum well active layer. Although the reliability of the semiconductor laser device is improved by the provision of the tensile strain barrier layers, the above semiconductor laser devices cannot attain to a practical reliability level or high output characteristics.

SUMMARY OF THE INVENTION

An object of the present invention is to provide a semiconductor laser device which can compensate for compressive strain in an active layer, and is reliable in a wide output power range from low to high output power.

(1) According to the first aspect of the present invention, there is provided a semiconductor laser device comprising a substrate and an active region being formed above the substrate. The active region includes an active layer and optical waveguide layers. The active layer has a predetermined amount of compressive strain and a predetermined thickness, and the optical waveguide layers have a predetermined amount of tensile strain and a predetermined total thickness, and are formed so that the active layer is sandwiched between the optical waveguide layers. The absolute value of the sum of the product of the predetermined amount of compressive strain and the predetermined thickness of the active layer and the product of the predetermined amount of tensile strain and the predetermined total thickness of the optical waveguide layers is equal to or smaller than 0.05 nm.

The strain $\Delta a$ of the (single quantum well) active layer and the strain $\Delta w$ of the tensile strain optical waveguide layers can be expressed by $$\Delta a = (c_a - c_s)/c_s, \text{ and}$$

$$\Delta w = (c_w - c_s)/c_s,$$

where $c_a$, $c_w$, and $c_s$ are lattice constants of the active layer, the tensile strain optical waveguide layers, and the substrate, respectively.

In this case, according to the first aspect of the present invention, the active layer and the tensile strain optical waveguide layers satisfy the inequality, $$|\Delta a \cdot da + \Delta w \cdot dw| \leq 0.05 \text{ nm},$$

where da and dw are respectively the total thickness of the active layer and the total thickness of the tensile strain optical waveguide layers.

Preferably, the semiconductor laser device according to the first aspect of the present invention may also have one or any possible combination of the following additional features (i) to (viii).

(i) The substrate may be made of GaAs, the active layer may be made of $In_{x1}Ga_{1-x1}As_{1-y1}P_{y1}$, and the optical waveguide layers may be made of $In_{x3}Ga_{1-x3}As_{1-y3}P_{y3}$, where $0.4 \geq x1 > 0.49y1$, $0 \leq y1 \leq 0.1$, $0 < x3 < 0.49y3$, and $0 < y3 \leq 0.5$.

(ii) The semiconductor laser device according to the first aspect of the present invention may further comprise a cladding layer formed between the substrate and the active region, wherein the substrate may be made of GaAs, the cladding layer may be made of one of $In_{x4}Ga_{1-x4}As_{1-y4}P_{y4}$ and $Al_{z1}Ga_{1-z1}As$, where $x4 = (0.49 \pm 0.01)y4$, $0.9 \leq y4 \leq 1$, and $0.2 \leq z1 \leq 0.7$.

(iii) The semiconductor laser device according to the first aspect of the present invention may further comprise a current confinement layer which is formed above the active region, and includes a groove allowing current injection into the active layer so as to realize an index-guided structure.

(iv) In the semiconductor laser device having the additional feature (iii), the groove may have a width of 1 to 4 micrometers, and the difference in the equivalent refractive index between the portion of the active layer which is located under the groove and the other portions of the active layer which are not located under the groove may be $1.5 \times 10^{-3}$ to $7 \times 10^{-3}$.

In the internal stripe structure, when the equivalent refractive index at the oscillation wavelength in the portions of the active layer which are not located under the groove is denoted by na, and the equivalent refractive index at the oscillation wavelength in the portion of the active layer which is located under the groove is denoted by nb, the difference $\Delta n$ in an equivalent refractive index between the portions of the active layer which are not located under the groove and the portion of the active layer which is located under the groove is expressed by $\Delta n = nb - na$.

(v) In the semiconductor laser device having the additional feature (iii), the groove may have a width greater than 4 micrometers, and the difference in the equivalent refractive index between the portion of the active layer which is located under the groove and the other portions of the active layer which are not located under the groove may be $2 \times 10^{-3}$ or more.

(vi) Predetermined regions of the semiconductor laser device except for a predetermined stripe region of the semiconductor laser device may be removed so that a ridge-shaped current path and an index-guided structure are realized.

(vii) In the semiconductor laser device having the additional feature (vi), the predetermined stripe region may have a width of 1 to 4 micrometers, and the difference in the equivalent refractive index between the portion of the active layer which is located under the predetermined stripe region and the other portions of the active layer which are not located under the predetermined stripe region may be $1.5 \times 10^{-3}$ to $7 \times 10^{-3}$.

In the ridge stripe structure, when the equivalent refractive index at the oscillation wavelength in the portions of the active layer which are not located under the ridge (predetermined) stripe region is denoted by nA, and the equivalent refractive index at the oscillation wavelength in the portion of the active layer which is located under the ridge (predetermined) stripe region is denoted by nB, the difference $\Delta N$ in an equivalent refractive index between the portions of the active layer which are not located under the ridge (predetermined) stripe region and the portion of the active layer which is located under the ridge (predetermined) stripe region is expressed by $\Delta N = nB - nA$.

(viii) In the semiconductor laser device having the additional feature (vi), the predetermined stripe region may have a width greater than 4 micrometers, and the difference in the equivalent refractive index between the portion of the active layer which is located under the predetermined stripe region and the other portions of the active layer which are not located under the predetermined stripe region may be $2 \times 10^{-3}$ or more.

(2) According to the second aspect of the present invention, there is provided a semiconductor laser device comprising a substrate and an active region being formed above the substrate. The active region includes an active layer and optical waveguide layers. Further, the active layer includes a plurality of quantum well sublayers and at least one barrier sublayer formed between the plurality of quantum well sublayers, and the optical waveguide layers have a predetermined amount of tensile strain and a first predetermined total thickness, and are formed so that the active layer is sandwiched between the optical waveguide layers. The plurality of quantum well sublayers have a predetermined amount of compressive strain and a second predetermined total thickness, and the at least one barrier sublayer has the predetermined amount of tensile strain and a third predetermined total thickness. In addition, the absolute value of the sum of the product of the predetermined amount of compressive strain and the second predetermined total thickness and the product of the predetermined amount of tensile strain and the sum of the first predetermined total thickness and the third predetermined total thickness is equal to or smaller than 0.05 nm.

Preferably, the semiconductor laser device according to the second aspect of the present invention may also have one or any possible combination of the aforementioned additional features (ii) to (viii) and the following additional feature (ix).

(ix) The substrate may be made of GaAs, the plurality of quantum well sublayers may be made of $In_{x1}Ga_{1-x1}As_{1-y1}P_{y1}$, and the optical waveguide layers and the at least one barrier sublayer may be made of $In_{x3}Ga_{1-x3}As_{1-y3}P_{y3}$, where $0.4 \geq x1 > 0.49y1$, $0 \leq y1 \leq 0.1$, $0 < x3 < 0.49y3$, and $0 < y3 \leq 0.5$.

That is, according to the second aspect of the present invention, the (multiple quantum well) active layer and the optical waveguide layers satisfy the inequality, $$|\Delta a' \cdot da' + \Delta w \cdot (dw + db)| \leq 0.05 \, nm$$

where $\Delta a'$ and $da'$ respectively denote the amount of compressive strain and the total thickness of the plurality of quantum well sublayer in the (multiple quantum well) active layer, $\Delta w$ denotes the amount of tensile strain of the optical waveguide layers and the at least barrier sublayer in the (multiple quantum well) active layer, $dw$ denotes the total thickness of the optical waveguide layers, and $db$ denotes the total thickness of the at least barrier sublayer in the (multiple quantum well) active layer.

By the way, when c is a lattice constant of a layer formed above the substrate, and the absolute value of the amount $(c - c_s)/c_s$ is equal to or smaller than 0.001, the layer is lattice-matched with the substrate.

(3) The present invention has the following advantages.

(a) In the semiconductor laser device according to the first aspect of the present invention, the compressive strain active region is formed above the substrate, and the compressive strain active region includes an active layer sandwiched between tensile strain optical waveguide layers. In addition, the absolute value of the sum of the product of the amount of compressive strain and the thickness of the compressive strain quantum well active layer and the product of the amount of tensile strain and the total thickness of the optical waveguide layers is equal to or smaller than 0.05 nm. Therefore, the compressive strain of the compressive strain quantum well active layer is compensated for by the tensile strain of the optical waveguide layers, and the interlayer stress produced between the active region and adjacent layers becomes small. Thus, crystal defects in vicinities of the active region can be reduced. Resultantly, the semiconductor laser device according to the first aspect of the present invention is highly reliable even in operation with high output power.

(b) In the semiconductor laser device according to the second aspect of the present invention, the active region is formed above the substrate, and the active region includes optical waveguide layers and the active layer sandwiched between the optical waveguide layers. In addition, the active layer includes a plurality of quantum well sublayers and at least one barrier sublayer formed between the plurality of quantum well sublayers. Further, the absolute value of the sum of the product of the amount of compressive strain and the total thickness of the one or more quantum well sublayers, the product of the amount of tensile strain and the total thickness of the optical waveguide layers, and the product of the amount of tensile strain and the total thickness of the at least one barrier sublayer is equal to or smaller than 0.05 nm.

Therefore, the compressive strain of the one or more quantum well sublayers are compensated for by the tensile strain of the at least one barrier sublayer, and the average strain of the active layer becomes small. Thus, the interlayer stress produced between the active layer and adjacent optical waveguide layers becomes small. Resultantly, crystal defects in the active region can be reduced.

Further, the average compressive strain of the active layer is also compensated for by the tensile strain of the optical waveguide layers. Therefore, the interlayer stress produced between the active region and adjacent layers becomes small. Thus, crystal defects in vicinities of the active region can be reduced.

Consequently, the semiconductor laser device according to the second aspect of the present invention is highly reliable even in operation with high output power.

(c) When the difference in the equivalent refractive index between the portion of the active layer which is located under the groove and the other portions of the active layer which are not located under the groove is in the range of $1.5 \times 10^{-3}$ to $7 \times 10^{-3}$ in the semiconductor laser devices according to the present invention having an index-guided structure with a stripe width of 1 to 4 micrometers, the semiconductor laser device can emit laser light in a fundamental transverse mode even in operation with high output power.

(d) When the difference in the equivalent refractive index between the portion of the active layer which is located under the groove and the other portions of the active layer which are not located under the groove is $2 \times 10^{-3}$ or more in the semiconductor laser devices according to the present invention having an index-guided structure with a stripe width greater than 4 micrometers, the semiconductor laser device can emit highly reliable laser light with low noise even in multiple modes.

DESCRIPTION OF THE DRAWINGS

FIG. 1 is a cross-sectional view of a semiconductor laser device as a first embodiment of the present invention.

FIG. 3 is a graph indicating increase rates of driving currents in the examples of the conventional semiconductor laser devices, in which the absolute values of average strains $\Delta a \cdot da + \Delta w \cdot dw$ of active regions are greater than 0.05 nm.

FIG. 4 is a graph indicating increase rates of driving currents in the examples of the semiconductor laser device as the first embodiment of the present invention, in which the absolute values of average strains $\Delta a \cdot da + \Delta w \cdot dw$ of active regions are equal to or smaller than 0.05 nm.

DESCRIPTION OF PREFERRED EMBODIMENTS

Figure 2:
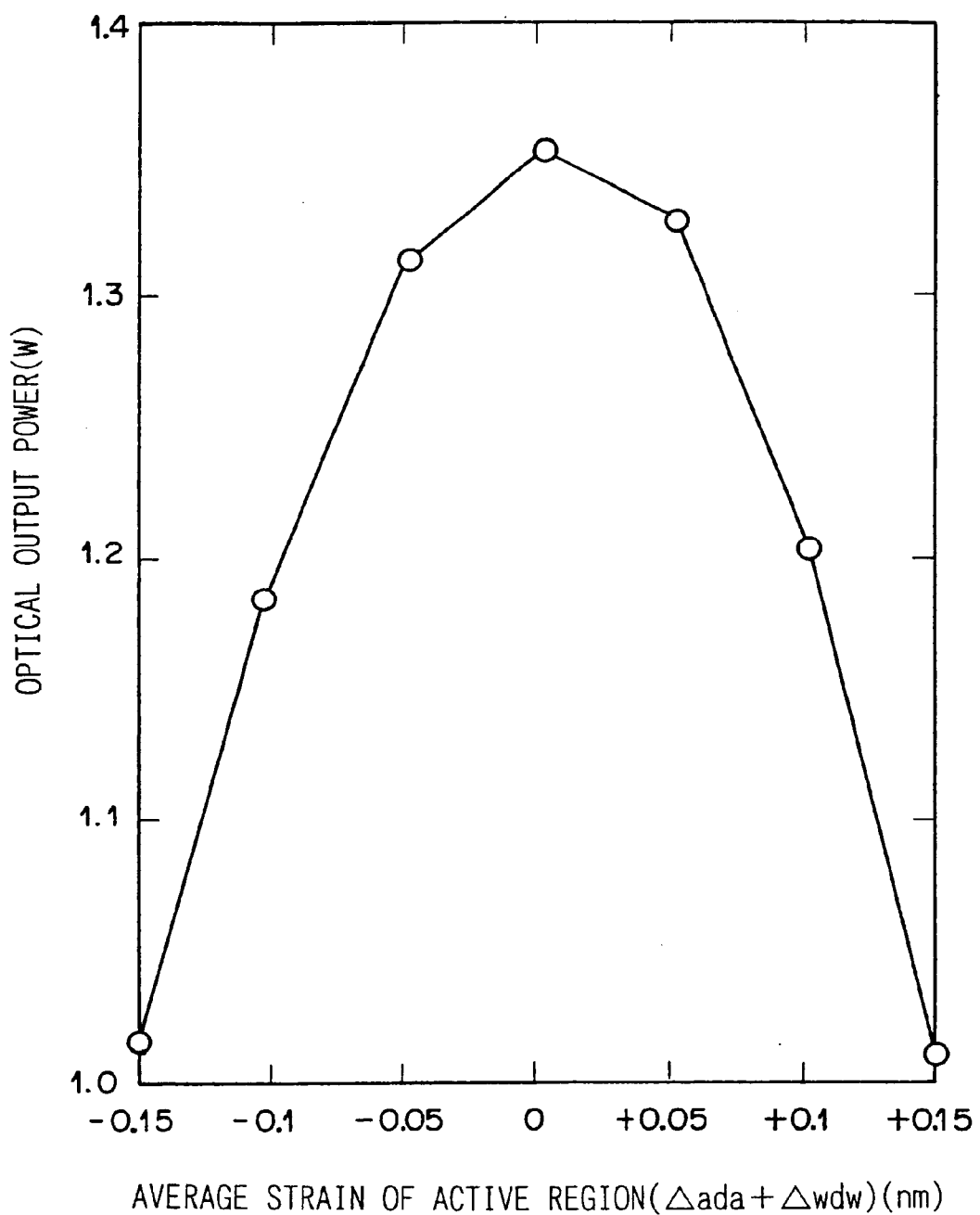
FIG. 2 is a graph indicating the maximum optical output power in a plurality of examples of semiconductor laser devices having different average strains $\Delta a \cdot da + \Delta w \cdot dw$ in their active regions.

Embodiments of the present invention are explained in detail below with reference to drawings.

First Embodiment

A process for producing a semiconductor laser device as the first embodiment of the present invention is explained below. FIG. 1 is a cross-sectional view of a semiconductor laser device as the first embodiment of the present invention.

First, as illustrated in FIG. 1, an n-type $In_{0.49}Ga_{0.51}P$ lower cladding layer 2, an n-type or i-type (intrinsic) $In_{x3}Ga_{1-x3}As_{1-y3}P_{y3}$ tensile strain optical waveguide layer 3 ($0<x3<0.49y3$, $0<y3\leq0.5$), an $In_{x1}Ga_{1-x1}As_{1-y1}P_{y1}$ compressive strain quantum well active layer 4 ($0.4\geq x1>0.49y1$, $0\leq y1\leq0.1$) having a thickness of about 3 to 20 nm, a p-type or i-type $In_{x3}Ga_{1-x3}As_{1-y3}P_{y3}$ tensile strain optical waveguide layer 5, a p-type $In_{0.49}Ga_{0.51}P$ upper cladding layer 6, and a p-type GaAs contact layer 7 are formed on an n-type GaAs substrate 1 by organometallic vapor phase epitaxy.

Subsequently, a $SiO_2$ film 8 is formed on the p-type GaAs contact layer 7, and a predetermined stripe area of the $SiO_2$ film 8 having a width of about 50 micrometers and extending in the <011> direction is removed by conventional lithography so that a stripe area of the p-type GaAs contact layer 7 is exposed. Then, a p electrode 9 is formed over the exposed area of the p-type GaAs contact layer 7 and the $SiO_2$ film 8. Next, the exposed (opposite) surface of the substrate 1 is polished, and an n electrode 10 is formed on the polished surface of the substrate 1.

Thereafter, a semiconductor wafer on which the above structure is formed is cleaved so as to form resonator surfaces. Then, high-reflection coating and low-reflection coating are laid on the resonator surfaces. Finally, the construction of FIG. 1 is formed into a semiconductor laser chip.

Although the above semiconductor laser device has an oxide-film stripe structure, the above structure including a compressive strain quantum well active layer sandwiched between tensile strain optical waveguide layers can also be used in semiconductor laser devices having an index-guided structure such as an internal stripe structure or a ridge structure.

FIG. 2 is a graph indicating the maximum optical output power in a plurality of examples of semiconductor laser devices having different average strains $\Delta a \cdot da + \Delta w \cdot dw$ in their active regions, where the strain $\Delta w$ of the tensile strain optical waveguide layer is varied from 0.000 to −0.006 in 0.001 steps by varying the composition ratio of Ga and In. In each example, the active layer has a single quantum well structure, composition ratios of x1=0.3 and y1=0, a strain $\Delta a$ of 0.021, and a thickness da of 7 nm, and the tensile strain optical waveguide layers have a composition ratio of y1=0.25 and a total thickness dw of 50 nm. In addition, the thickness db of a barrier layer in the active layer is zero.

As illustrated in FIG. 2, when the absolute of the average strain $\Delta a \cdot da + \Delta w \cdot dw$ in an active region exceeds 0.05 nm, the maximum optical output power decreases. This decrease is considered to be caused by generation of defects in the active layer. Therefore, it is preferable that the absolute value of the average strain $\Delta a \cdot da + \Delta w \cdot dw$ in the active region is equal to or less than 0.05 nm.

Results of reliability tests of examples of the conventional semiconductor laser devices and the semiconductor laser device as the first embodiment of the present invention are indicated in FIGS. 3 and 4. FIG. 3 shows increase rates of driving currents in the examples of the conventional semiconductor laser devices, in which the absolute values of average strains $\Delta a \cdot da + \Delta w \cdot dw$ of active regions are greater than 0.05 nm, and FIG. 4 shows increase rates of driving currents in the examples of the semiconductor laser device as the first embodiment of the present invention, in which the absolute values of average strains $\Delta a \cdot da + \Delta w \cdot dw$ of active regions are equal to or smaller than 0.05 nm. Specifically, in the examples of FIG. 3, the average strains $\Delta a \cdot da + \Delta w \cdot dw$ of the active regions are −0.1 and 0.1 nm. On the other hand, in the examples of FIG. 4, the average strains $\Delta a \cdot da + \Delta w \cdot dw$ of the active regions are −0.05, 0.00, and 0.05 nm. The measurement is made at a temperature of 25° C. with constant optical output power of 500 mW.

As indicated in FIGS. 3 and 4, the increase rates of the driving currents in semiconductor laser devices in FIG. 3 are about ten times greater than those in FIG. 4, and the semiconductor laser devices in FIG. 3 cannot be practically used. On the other hand, there is no significant difference in the increase rates of the driving currents between the examples indicated in FIG. 4. When the lifetime of a semiconductor laser device is defined as a time from the beginning of use of the semiconductor laser device until the driving current increases by 20%, the lifetime of the semiconductor laser devices indicated in FIG. 4 can be determined by extrapolation to be more than 10,000 hours. That is, the semiconductor laser devices indicated in FIG. 4 can be practically used. In other words, when the average strain $\Delta a \cdot da + \Delta w \cdot dw$ of the active region is between −0.05 and 0.05 nm, high reliability can be achieved.

Second Embodiment

Figure 5A:
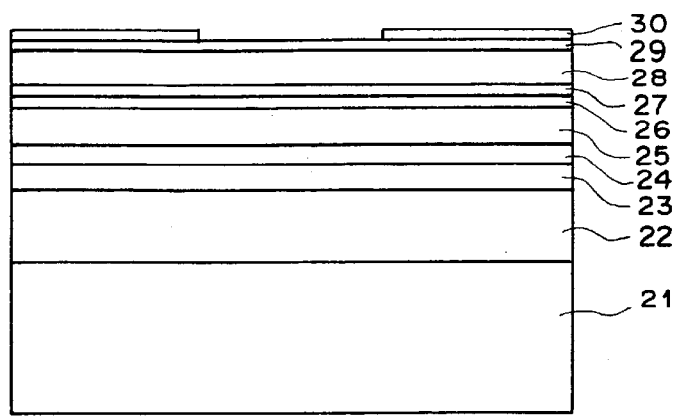
FIGS. 5A to 5C are cross-sectional views of representative stages of a process for producing a semiconductor laser device as a second embodiment of the present invention.
Figure 5B:
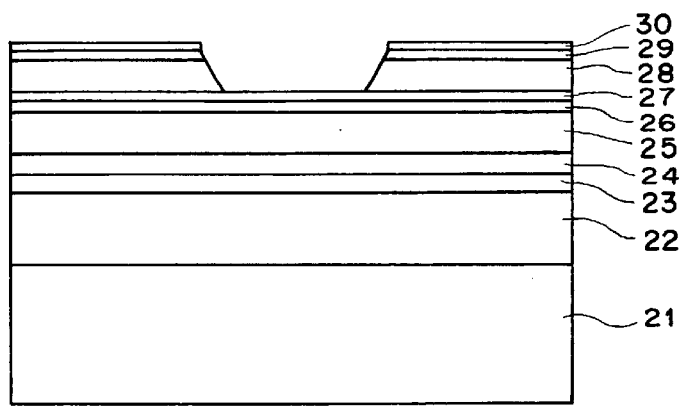
Figure 5C:
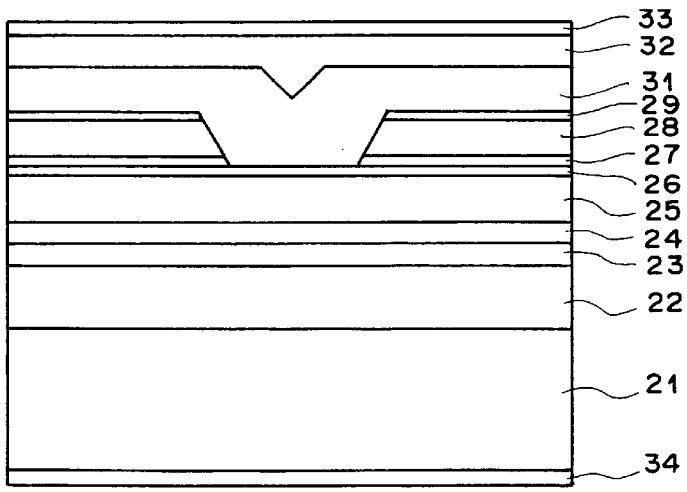

A process for producing a semiconductor laser device as the second embodiment of the present invention is explained below. FIGS. 5A to 5C are cross-sectional views of representative stages of a process for producing a semiconductor laser device as a second embodiment of the present invention.

First, as illustrated in FIG. 5A, an n-type $In_{0.49}Ga_{0.51}P$ lower cladding layer 22, an n-type or i-type (intrinsic) $In_{x3}Ga_{1-x3}As_{1-y3}P_{y3}$ tensile strain optical waveguide layer 23 ($0<x3<0.49y3$, $0<y3\leq0.5$), an $In_{x1}Ga_{1-x1}As_{1-y1}P_{y1}$ compressive strain quantum well active layer 24 ($0.4\geq x1>0.49y1$, $0\leq y1\leq 0.1$) having a thickness of about 3 to 20 nm, a p-type or i-type $In_{x3}Ga_{1-x3}As_{1-y3}P_{y3}$ tensile strain optical waveguide layer 25, a p-type GaAs first etching stop layer 26, a p-type $In_{x4}Ga_{1-x4}P$ second etching stop layer 27 ($0\leq x4\leq 1$) having a thickness of about 5 to 20 nm, an n-type $Al_{z2}Ga_{1-z2}As$ current confinement layer 28 ($0.2<z2\leq 0.8$), and an n-type GaAs cap layer 29 having a thickness of about 10 nm are formed on an n-type GaAs substrate 21 by organometallic vapor phase epitaxy.

Subsequently, a $SiO_2$ film 30 is formed on the n-type GaAs cap layer 29, and a predetermined stripe area of the $SiO_2$ film 30 having a width of about 3 micrometers and extending in the <011> direction is removed by conventional lithography so that a stripe area of the n-type GaAs cap layer 29 is exposed. Next, as illustrated in FIG. 5B, stripe areas of the n-type GaAs cap layer 29 and the n-type $Al_{z2}Ga_{1-z2}As$ current confinement layer 28 are etched with a sulfuric acid etchant by using the remaining areas of the $SiO_2$ film 30 as a mask until a stripe area of the p-type $In_{x4}Ga_{1-x4}P$ second etching stop layer 27 is exposed.

Next, as illustrated in FIG. 5C, the exposed stripe area of the p-type $In_{x4}Ga_{1-x4}P$ second etching stop layer 27 is etched with a hydrochloric acid etchant so that a stripe area of the p-type GaAs first etching stop layer 26 is exposed. Then, the remaining areas of the $SiO_2$ film 30 are removed by etching with a fluoric acid etchant.

Thereafter, a p-type $Al_{z1}Ga_{1-z1}As$ upper cladding layer 31 ($0.2\leq z1<z2$) and a p-type GaAs contact layer 32 are formed. Then, a p electrode 33 is formed over the exposed area of the p-type GaAs contact layer 32. Next, the exposed (opposite) surface of the substrate 21 is polished, and an n electrode 34 is formed on the polished surface of the substrate 21. Then, a semiconductor wafer on which the above structure is formed is cleaved so as to form resonator surfaces. Subsequently, high-reflection coating and low-reflection coating are laid on the resonator surfaces. Finally, the construction of FIG. 5C is formed into a semiconductor laser chip.

In the above construction, the p-type or i-type $In_{x3}Ga_{1-x3}As_{1-y3}P_{y3}$ tensile strain optical waveguide layer 25 is arranged to have such a thickness that oscillation in a fundamental transverse mode can be maintained even when the semiconductor laser device operates with high output power.

In addition, since a current path is internally formed in the construction of the second embodiment, the contact area between the electrode and the contact layer can be increased. Therefore, it is possible to reduce the contact resistance, improve the electric characteristics, and increase the reliability. Further, in the construction in which the current path is internally formed, the controllability of the stripe width is high. Therefore, the index-guided structure can be formed with high precision.

In the construction of FIG. 5C, the lower cladding layer 22 may be made of $Al_{z1}Ga_{1-z1}As$ ($0.2\leq z1\leq 0.7$), instead of $In_{0.49}Ga_{0.51}P$.

Third Embodiment

Figure 6:
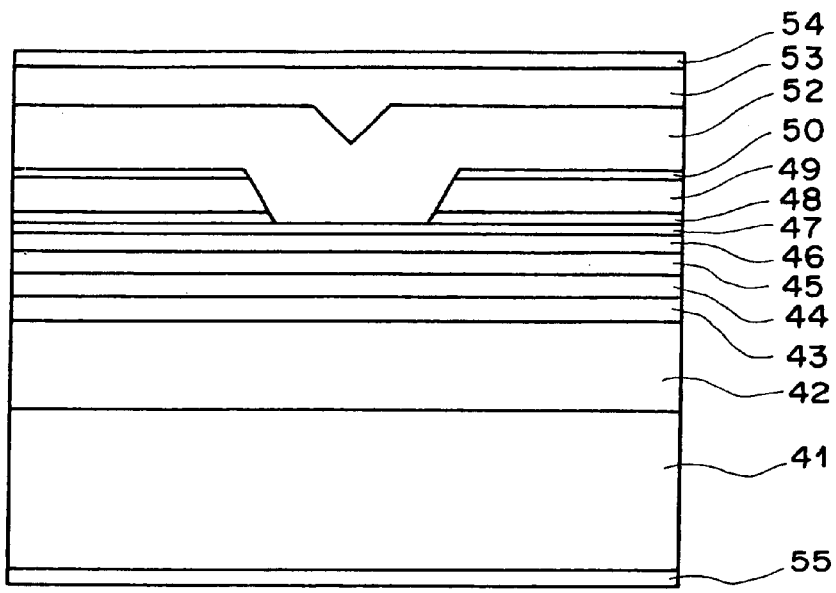
FIG. 6 is a cross-sectional view of a semiconductor laser device as a third embodiment of the present invention.

A process for producing a semiconductor laser device as the third embodiment of the present invention is explained below. FIG. 6 is a cross-sectional view of a semiconductor laser device as the third embodiment of the present invention.

First, as illustrated in FIG. 6, an n-type $Al_{z1}Ga_{1-z1}As$ lower cladding layer 42 ($0.2\leq z1\leq 0.7$), an n-type or i-type (intrinsic) $In_{x3}Ga_{1-x3}As_{1-y3}P_{y3}$ tensile strain optical waveguide layer 43 ($0<x3<0.49y3$, $0<y3\leq 0.5$), an $In_{x1}Ga_{1-x1}As_{1-y1}P_{y1}$ compressive strain quantum well active layer 44 ($0.4\geq x1>0.49y1$, $0\leq y1\leq 0.1$) having a thickness of about 3 to 20 nm, a p-type or i-type $In_{x3}Ga_{1-x3}As_{1-y3}P_{y3}$ tensile strain optical waveguide layer 45, a p-type $Al_{z1}Ga_{1-z1}As$ first upper cladding layer 46, a p-type GaAs first etching stop layer 47, a p-type $In_{x4}Ga_{1-x4}P$ second etching stop layer 48 ($0\leq x4\leq 1$) having a thickness of about 5 to 20 nm, an n-type $Al_{z2}Ga_{1-z2}As$ current confinement layer 49 ($z1<z2\leq 0.8$) having a thickness of 1 micrometer, and an n-type GaAs cap layer 50 having a thickness of 10 nm are formed on an n-type GaAs substrate 41 by organometallic vapor phase epitaxy.

Subsequently, a $SiO_2$ film (not shown) is formed on the n-type GaAs cap layer 50, and a predetermined stripe area of the $SiO_2$ film having a width of about 3 micrometers and extending in the <011> direction is removed by conventional lithography so that a stripe area of the n-type GaAs cap layer 50 is exposed. Next, stripe areas of the n-type GaAs cap layer 50 and the n-type $Al_{z2}Ga_{1-z2}As$ current confinement layer 49 are etched with a sulfuric acid etchant by using the remaining areas of the $SiO_2$ film as a mask until a stripe area of the p-type $In_{x4}Ga_{1-x4}P$ second etching stop layer 48 is exposed.

Next, the exposed stripe area of the p-type $In_{x4}Ga_{1-x4}P$ second etching stop layer 48 is etched with a hydrochloric acid etchant so that a stripe area of the p-type GaAs first etching stop layer 47 is exposed. Then, the remaining areas of the $SiO_2$ film are removed by etching with a fluoric acid etchant.

Thereafter, a p-type $Al_{z1}Ga_{1-z1}As$ second upper cladding layer 52 and a p-type GaAs contact layer 53 are formed. Then, a p electrode 54 is formed over the exposed area of the p-type GaAs contact layer 53. Next, the exposed (opposite) surface of the substrate 41 is polished, and an n electrode 55 is formed on the polished surface of the substrate 41. Then, a semiconductor wafer on which the above structure is formed is cleaved so as to form resonator surfaces. Subsequently, high-reflection coating and low-reflection coating are laid on the resonator surfaces. Finally, the construction of FIG. 6 is formed into a semiconductor laser chip.

In the above construction, the total thickness of the p-type or i-type $In_{x3}Ga_{1-x3}As_{1-y3}P_{y3}$ tensile strain optical waveguide layer 45 and the p-type $Al_{z1}Ga_{1-z1}As$ first upper cladding layer 46 are so determined that oscillation in a fundamental transverse mode can be maintained even when the semiconductor laser device operates with high output power.

Fourth Embodiment

Figure 7:
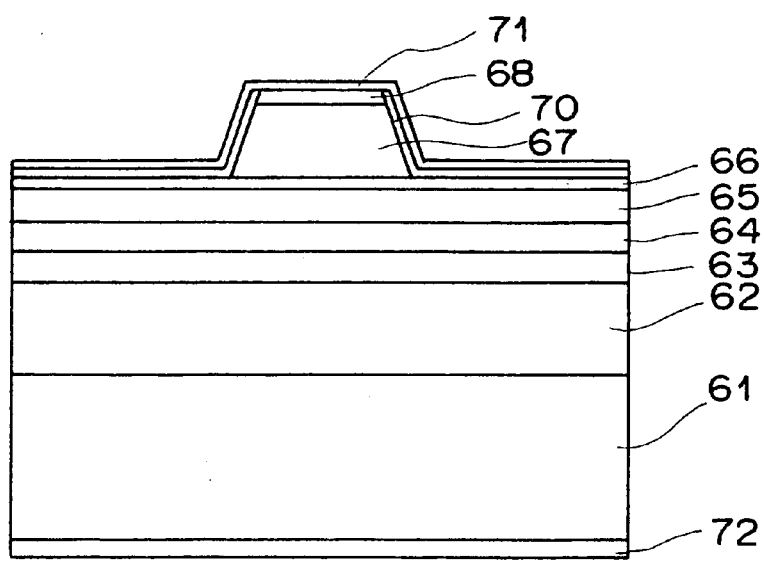
FIG. 7 is a cross-sectional view of a semiconductor laser device as a fourth embodiment of the present invention.

A process for producing a semiconductor laser device as the fourth embodiment of the present invention is explained below. FIG. 7 is a cross-sectional view of a semiconductor laser device as the fourth embodiment of the present invention.

First, as illustrated in FIG. 7, an n-type $Al_{z1}Ga_{1-z1}As$ lower cladding layer 62 ($0.2 \leq z1 \leq 0.7$), an n-type or i-type (intrinsic) $In_{x3}Ga_{1-x3}As_{1-y3}P_{y3}$ tensile strain optical waveguide layer 63 ($0<x3<0.49y3$, $0<y3 \leq 0.5$), an $In_{x1}Ga_{1-x1}As_{1-y1}P_{y1}$ compressive strain quantum well active layer 64 ($0.4 \geq x1 > 0.49y1$, $0 \leq y1 \leq 0.1$) having a thickness of about 3 to 20 nm, a p-type or i-type $In_{x3}Ga_{1-x3}As_{1-y3}P_{y3}$ tensile strain optical waveguide layer 65, a p-type $In_{x4}Ga_{1-x4}P$ etching stop layer 66 ($0 \leq x4 \leq 1$) having a thickness of about 5 to 20 nm, a p-type $Al_{z1}Ga_{1-z1}As$ upper cladding layer 67, and a p-type GaAs contact layer 68 are formed on an n-type GaAs substrate 61 by organometallic vapor phase epitaxy.

Subsequently, a first insulation film (not shown) is formed on the p-type GaAs contact layer 68, and the first insulation film except for a predetermined stripe region having a width of about 3 micrometers is removed. In practice, the removed portions of the first insulation film have a width of about 10 micrometers.

Then, the layered structure formed as above is etched by wet etching using the remaining portions of the first insulation film as a mask until the p-type $In_{x4}Ga_{1-x4}P$ etching stop layer 66 is exposed. At this time, sulfuric acid and hydrogen peroxide are used as etchants. Therefore, the etching automatically stops at the upper surface of the p-type $In_{x4}Ga_{1-x4}P$ etching stop layer 66. Thus, the semiconductor layers above the p-type $In_{x4}Ga_{1-x4}P$ etching stop layer 66 except for the portion under the predetermined stripe region of the first insulation film are removed, i.e., a ridge stripe structure is formed.

Next, the remaining portion of the first insulation film is removed, and a second insulation film 70 is formed over the layered structure formed as above, and a stripe area of the second insulation film 70 on the top of the ridge stripe structure is removed by conventional lithography so that a stripe area of the p-type GaAs contact layer 68 on the top of the ridge stripe structure is exposed.

Thereafter, a p electrode 71 is formed over the second insulation film 70 and the exposed stripe area of the p-type GaAs contact layer 68. Then, the exposed (opposite) surface of the substrate 61 is polished, and an n electrode 72 is formed on the polished surface of the substrate 61. Next, a semiconductor wafer on which the above structure is formed is cleaved so as to form resonator surfaces. Subsequently, high-reflection coating and low-reflection coating are laid on the resonator surfaces. Finally, the construction of FIG. 7 is formed into a semiconductor laser chip.

In the above construction, the p-type or i-type $In_{x3}Ga_{1-x3}As_{1-y3}P_{y3}$ tensile strain optical waveguide layer 65 is arranged to have such a thickness and composition that oscillation in a fundamental transverse mode can be maintained even when the semiconductor laser device operates with high output power.

Fifth Embodiment

Figure 8:
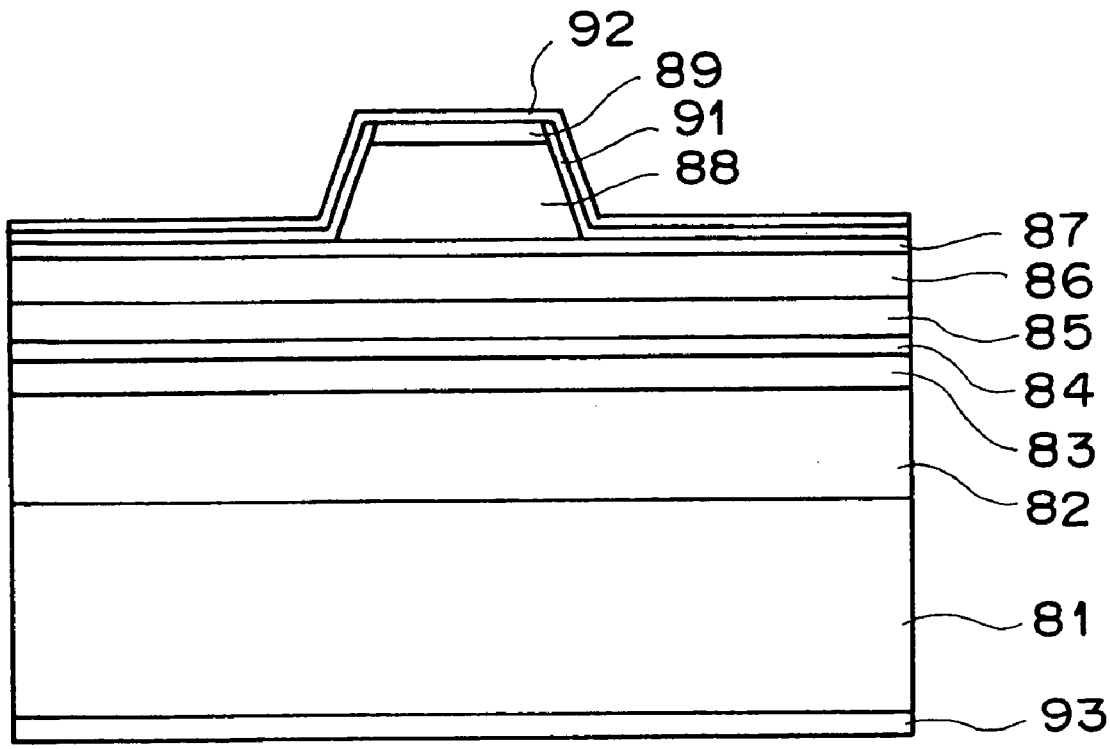
FIG. 8 is a cross-sectional view of a semiconductor laser device as a fifth embodiment of the present invention.

A process for producing a semiconductor laser device as the fifth embodiment of the present invention is explained below. FIG. 8 is a cross-sectional view of a semiconductor laser device as the fifth embodiment of the present invention.

First, as illustrated in FIG. 8, an n-type $Al_{z1}Ga_{1-z1}As$ lower cladding layer 82 ($0.2 \leq z1 \leq 0.7$), an n-type or i-type (intrinsic) $In_{x3}Ga_{1-x3}As_{1-y3}P_{y3}$ tensile strain optical waveguide layer 83 ($0<x3<0.49y3$, $0<y3 \leq 0.5$), an $In_{x1}Ga_{1-x1}As_{1-y1}P_{y1}$ compressive strain quantum well active layer 84 ($0.4 \geq x1 > 0.49y1$, $0 \leq y1 \leq 0.1$) having a thickness of about 3 to 20 nm, a p-type or i-type $In_{x3}Ga_{1-x3}As_{1-y3}P_{y3}$ tensile strain optical waveguide layer 85, a p-type $Al_{z1}Ga_{1-z1}As$ first upper cladding layer 86, a p-type $In_{x4}Ga_{1-x4}P$ etching stop layer 87 ($0.3 \leq x4 \leq 0.7$) having a thickness of about 5 to 20 nm, a p-type $Al_{z1}Ga_{1-z1}As$ second upper cladding layer 88, and a p-type GaAs contact layer 89 are formed on an n-type GaAs substrate 81 by organometallic vapor phase epitaxy.

Subsequently, a first insulation film (not shown) is formed on the p-type GaAs contact layer 89, and the first insulation film except for a predetermined stripe region having a width of about 3 micrometers is removed. In practice, the removed portions of the first insulation film have a width of about 10 micrometers.

Then, the layered structure formed as above is etched by wet etching using the remaining portions of the first insulation film as a mask until the p-type $In_{x4}Ga_{1-x4}P$ etching stop layer 87 is exposed. At this time, sulfuric acid and hydrogen peroxide are used as etchants. Therefore, the etching automatically stops at the upper surface of the p-type $In_{x4}Ga_{1-x4}P$ etching stop layer 87. Thus, the semiconductor layers above the p-type $In_{x4}Ga_{1-x4}P$ etching stop layer 87 except for the portion under the predetermined stripe region of the first insulation film are removed, i.e., a ridge stripe structure is formed.

Next, the remaining portion of the first insulation film is removed, and a second insulation film 91 is formed over the layered structure formed as above. Then, a stripe portion of the second insulation film 91 on the top of the ridge stripe structure is removed by conventional lithography so that a stripe area of the p-type GaAs contact layer 89 on the top of the ridge stripe structure is exposed.

Thereafter, a p electrode 92 is formed over the second insulation film 91 and the exposed stripe area of the p-type GaAs contact layer 89. Then, the exposed (opposite) surface of the substrate 81 is polished, and an n electrode 93 is formed on the polished surface of the substrate 81. Next, a semiconductor wafer on which the above structure is formed is cleaved so as to form resonator surfaces. Subsequently, high-reflection coating and low-reflection coating are laid on the resonator surfaces. Finally, the construction of FIG. 8 is formed into a semiconductor laser chip.

In the above construction, the total thickness of the p-type or i-type $In_{x3}Ga_{1-x3}As_{1-y3}P_{y3}$ tensile strain optical waveguide layer 85 and the p-type $Al_{z1}Ga_{1-z1}As$ first upper cladding layer 86 are so determined that oscillation in a fundamental transverse mode can be maintained even when the semiconductor laser device operates with high output power.

Variations and Other Matters (i) Although the semiconductor laser devices as the second, third, and fourth embodiments have an index-guided structure, the structures disclosed in the second, third, and fourth embodiments can also be used in semiconductor laser devices having a diffraction grating as well as in optical integrated circuits.

(ii) Although the semiconductor laser devices as the second, third, and fourth embodiments are designed for oscillation in a fundamental transverse mode, the structures disclosed in the second, third, and fourth embodiments can also be used in broad-stripe index-guided semiconductor laser devices each of which has a stripe width greater than 4 micrometers and oscillates in multiple modes. Since the broad-stripe index-guided semiconductor laser devices exhibit low noise characteristics, the broad-stripe index-guided semiconductor laser devices can be used as a high-power semiconductor laser device, for example, for excitation of a solid-state laser.

(iii) Since the active layers in the semiconductor laser devices as the first to fifth embodiments of the present invention have a composition of $In_{x1}Ga_{1-x1}As_{1-y1}P_{y1}$ ($0.49y1 < x1 \leq 0.4$, $0 \leq y1 \leq 0.1$), the oscillation wavelengths of the semiconductor laser devices as the first to fifth embodiments of the present invention can be controlled in the range of 900 to 1200 nm.

(iv) Although the n-type GaAs substrates are used in the constructions of the first to fifth embodiments of the present invention, instead, p-type GaAs substrates may be used. When the GaAs substrate in the construction of each embodiment is a p-type, the conductivity types of all of the other layers in the construction should be inverted.

(v) Each layer in the constructions of the first to fifth embodiments may be formed by molecular beam epitaxy using solid or gas raw material.

(vi) In the construction of each embodiment, the compressive strain quantum well active layer may be a multiple quantum well active layer which includes a plurality of quantum well layers. It is possible and preferable that the multiple quantum well active layer is formed by arranging a barrier layer having the same composition as the optical waveguide layers between each pair of adjacent ones of the plurality of quantum well layers.

(vii) Since the strain is compensated for, the semiconductor laser devices according to the present invention is reliable in a wide output power range from low to high output power, and can therefore be used as a light source in the fields of high-speed information and image processing, communications, laser measurement, medicine, printing, and the like.

What is claimed is:

1. A semiconductor laser device comprising:
    a substrate; and
    an active region being formed above said substrate and including,
        an active layer having a predetermined amount of compressive strain and a predetermined thickness, and
        optical waveguide layers having a predetermined amount of tensile strain and a predetermined total thickness and being formed so that said active layer is sandwiched between the optical waveguide layers;
    wherein an absolute value of a sum of first and second products is equal to or smaller than 0.05 nm, where said first product is a product of said predetermined amount of compressive strain and said predetermined thickness of said active layer, and said second product is a product of said predetermined amount of tensile strain and said predetermined total thickness of said optical waveguide layers.

2. A semiconductor laser device according to claim 1, wherein said substrate is made of GaAs, said active layer is made of $In_{x1}Ga_{1-x1}As_{1-y1}P_{y1}$, and said optical waveguide layers are made of $In_{x3}Ga_{1-x3}As_{1-y3}P_{y3}$, where $0.4 \geq x1 > 0.49y1$, $0 \leq y1 \leq 0.1$, $0 < x3 < 0.49y3$, and $0 < y3 \leq 0.5$.

3. A semiconductor laser device according to claim 1, further comprising a cladding layer formed between said substrate and said active region, wherein said substrate is made of GaAs, said cladding layer is made of one of $In_{x4}Ga_{1-x4}As_{1-y4}P_{y4}$ and $Al_{z1}Ga_{1-z1}As$, where $x4 = (0.49 \pm 0.01)y4$, $0.9 \leq y4 \leq 1$, and $0.2 \leq z1 \leq 0.7$.

4. A semiconductor laser device according to claim 1, further comprising a current confinement layer which is formed above said active region, and includes a groove allowing current injection into said active layer so as to realize an index-guided structure.

5. A semiconductor laser device according to claim 4, wherein said groove has a width of 1 to 4 micrometers, and a difference in an equivalent refractive index between a portion of the active layer which is located under said groove and other portions of the active layer which are not located under said groove is $1.5 \times 10^{-3}$ to $7 \times 10^{-3}$.

6. A semiconductor laser device according to claim 4, wherein said groove has a width greater than 4 micrometers, and a difference in an equivalent refractive index between a portion of the active layer which is located under said groove and other portions of the active layer which are not located under said groove is $2 \times 10^{-3}$ or more.

7. A semiconductor laser device according to claim 1, wherein predetermined regions of said semiconductor laser device except for a predetermined stripe region of said semiconductor laser device are removed so that a ridge-shaped current path and an index-guided structure are realized.

8. A semiconductor laser device according to claim 7, wherein said predetermined stripe region has a width of 1 to 4 micrometers, and a difference in an equivalent refractive index between a portion of the active layer which is located under said predetermined stripe region and other portions of the active layer which are not located under said predetermined stripe region is $1.5 \times 10^{-3}$ to $7 \times 10^{-3}$.

9. A semiconductor laser device according to claim 7, wherein said predetermined stripe region has a width greater than 4 micrometers, and a difference in an equivalent refractive index between a portion of the active layer which is located under said predetermined stripe region and other portions of the active layer which are not located under said predetermined stripe region is $2 \times 10^{-3}$ or more.

10. A semiconductor laser device comprising:
    a substrate; and
    an active region being formed above said substrate and including,
        an active layer having a plurality of quantum well sublayers and at least one barrier sublayer formed between said plurality of quantum well sublayers, and
        optical waveguide layers having a predetermined amount of tensile strain and a first predetermined total thickness and being formed so that said active layer is sandwiched between the optical waveguide layers;
    wherein said plurality of quantum well sublayers have a predetermined amount of compressive strain and a second predetermined total thickness, said at least one barrier sublayer has said predetermined amount of tensile strain and a third predetermined total thickness, and an absolute value of a sum of first and second products is equal to or smaller than 0.05 nm, where said first product is a product of said predetermined amount of compressive strain and said second predetermined total thickness, and said second product is a product of said predetermined amount of tensile strain and a sum of said first predetermined total thickness and said third predetermined total thickness.

11. A semiconductor laser device according to claim 10, wherein said substrate is made of GaAs, said plurality of quantum well sublayers are made of $In_{x1}Ga_{1-x1}As_{1-y1}P_{y1}$, and said optical waveguide layers and said at least one barrier sublayer are made of $In_{x3}Ga_{1-x3}As_{1-y3}P_{y3}$, where $0.4 \geq x1 > 0.49y1$, $0 \leq y1 \leq 0.1$, $0 < x3 < 0.49y3$, and $0 < y3 \leq 0.5$.

12. A semiconductor laser device according to claim 10, further comprising a cladding layer formed between said substrate and said active region, wherein said substrate is made of GaAs, said cladding layer is made of one of $In_{x4}Ga_{1-x4}As_{1-y4}P_{y4}$ and $Al_{z1}Ga_{1-z1}As$, where $x4 = (0.49 \pm 0.01)y4$, $0.9 \leq y4 \leq 1$, and $0.2 \leq z1 \leq 0.7$.

13. A semiconductor laser device according to claim 10, further comprising a current confinement layer which is formed above said active region, and includes a groove allowing current injection into said active layer so as to realize an index-guided structure.

14. A semiconductor laser device according to claim 13, wherein said groove has a width of 1 to 4 micrometers, and a difference in an equivalent refractive index between a portion of the active layer which is located under said groove and other portions of the active layer which are not located under said groove is $1.5 \times 10^{-3}$ to $7 \times 10^{-3}$.

15. A semiconductor laser device according to claim 13, wherein said groove has a width greater than 4 micrometers, and a difference in an equivalent refractive index between a portion of the active layer which is located under said groove and other portions of the active layer which are not located under said groove is $2 \times 10^{-3}$ or more.

16. A semiconductor laser device according to claim 10, wherein predetermined regions of said semiconductor laser device except for a predetermined stripe region of said semiconductor laser device are removed so that a ridge-shaped current path and an index-guided structure are realized.

17. A semiconductor laser device according to claim 16, wherein said predetermined stripe region has a width of 1 to 4 micrometers, and a difference in an equivalent refractive index between a portion of the active layer which is located under said predetermined stripe region and other portions of the active layer which are not located under said predetermined stripe region is $1.5 \times 10^{-3}$ to $7 \times 10^{-3}$.

18. A semiconductor laser device according to claim 16, wherein said predetermined stripe region has a width greater than 4 micrometers, and a difference in an equivalent refractive index between a portion of the active layer which is located under said predetermined stripe region and other portions of the active layer which are not located under said predetermined stripe region is $2 \times 10^{-3}$ or more.

19. A semiconductor laser device according to claim 1, wherein the active layer is in direct contact with the optical waveguide layers.

20. A semiconductor laser device according to claim 1, wherein the active layer has a thickness of about 3 to 20 nm.

21. A semiconductor laser device according to claim 10, wherein the active layer is in direct contact with the optical waveguide layers.

22. A semiconductor laser device according to claim 10, wherein the active layer has a thickness of about 3 to 20 nm.

23. A semiconductor laser device according to claim 20, wherein the total thickness of the optical waveguide layers is approximately 50 nm.

24. A semiconductor laser device according to claim 23, wherein the strain of the active layer is approximately 0.021.

* * * * *